United States Patent
Doris et al.

(10) Patent No.: US 9,627,410 B2
(45) Date of Patent: Apr. 18, 2017

(54) METALLIZED JUNCTION FINFET STRUCTURES

(71) Applicant: International Business Machines Corporation, Armonk, NY (US)

(72) Inventors: Bruce B. Doris, Slingerlands, NY (US); Pranita Kerber, Mount Kisco, NY (US); Alexander Reznicek, Troy, NY (US); Joshua M. Rubin, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/718,500

(22) Filed: May 21, 2015

(65) Prior Publication Data

US 2016/0343734 A1    Nov. 24, 2016

(51) Int. Cl.
| | |
|---|---|
| *H01L 29/00* | (2006.01) |
| *H01L 27/12* | (2006.01) |
| *H01L 21/84* | (2006.01) |
| *H01L 29/45* | (2006.01) |
| *H01L 29/66* | (2006.01) |
| *H01L 21/285* | (2006.01) |
| *H01L 21/324* | (2006.01) |
| *H01L 29/16* | (2006.01) |
| *H01L 29/161* | (2006.01) |
| *H01L 21/02* | (2006.01) |

(Continued)

(52) U.S. Cl.
CPC .... *H01L 27/1211* (2013.01); *H01L 21/02532* (2013.01); *H01L 21/28518* (2013.01); *H01L 21/324* (2013.01); *H01L 21/845* (2013.01); *H01L 29/0688* (2013.01); *H01L 29/0847* (2013.01); *H01L 29/16* (2013.01); *H01L 29/161* (2013.01); *H01L 29/456* (2013.01); *H01L 29/6656* (2013.01)

(58) Field of Classification Search
CPC ............ H01L 27/1211; H01L 27/0886; H01L 29/6656; H01L 21/845; H01L 27/0924
See application file for complete search history.

(56) References Cited

U.S. PATENT DOCUMENTS

| | | | |
|---|---|---|---|
| 7,498,225 | B1 | 3/2009 | Wang |
| 7,504,336 | B2 | 3/2009 | Purtell |

(Continued)

OTHER PUBLICATIONS

Bruce B. Doris et al., unpublished U.S. Appl. No. 14/929,307, filed Oct. 31, 2015, pp. 1-12 plus 10 sheets drawings.
List of IBM Patents or Applications Treated as Related.

*Primary Examiner* — Su C Kim
*Assistant Examiner* — David S Wilbert
(74) *Attorney, Agent, or Firm* — Daniel P. Morris; Otterstedt, Ellenbogen & Kammer, LLP

(57) ABSTRACT

FinFET devices are provided wherein the current path is minimized and mostly limited to spacer regions before the channel carriers reach the metal contacts. The fins in the source/drain regions are metallized to increase the contact area and reduce contact resistance. Selective removal of semiconductor fins in the source/drain regions following source/drain epitaxy facilitates replacement thereof by the metallized fins. A spacer formed subsequent to source/drain epitaxy prevents the etching of extension/channel regions during semiconductor fin removal.

6 Claims, 10 Drawing Sheets

(51) Int. Cl.
   *H01L 29/08*    (2006.01)
   *H01L 29/06*    (2006.01)

(56) References Cited

U.S. PATENT DOCUMENTS

| | | |
|---|---|---|
| 7,691,690 B2 | 4/2010 | Zhu |
| 7,745,270 B2 | 6/2010 | Shah |
| 7,763,943 B2 | 7/2010 | Pillarisetty |
| 8,647,938 B1 | 2/2014 | Baars |
| 8,766,319 B2 | 7/2014 | Lai |
| 8,778,744 B2 | 7/2014 | Zhou |
| 2009/0101968 A1* | 4/2009 | Sugioka ............ H01L 29/41791 257/327 |
| 2011/0298058 A1* | 12/2011 | Kawasaki ........... H01L 29/7853 257/401 |
| 2013/0299895 A1 | 11/2013 | Oxland |
| 2014/0001520 A1* | 1/2014 | Glass ................ H01L 29/66439 257/288 |
| 2014/0248762 A1 | 9/2014 | Lai |
| 2014/0299934 A1* | 10/2014 | Kim .................... H01L 29/7848 257/347 |
| 2015/0214366 A1* | 7/2015 | Chang ............... H01L 29/66477 257/192 |
| 2015/0295089 A1* | 10/2015 | Huang ................ H01L 29/7853 257/401 |

\* cited by examiner

METALLIZED JUNCTION FINFET STRUCTURES

FIELD

The present disclosure relates to the physical sciences, and, more particularly, to fin-type field effect transistor (FinFET) structures and methods of fabrication thereof.

BACKGROUND

Some types of field effect transistors (FETs) have three-dimensional, non-planar configurations including fin-like structures. Such field effect transistors are referred to as FinFETs. Substrates employed for forming FinFETs may include semiconductor on insulator (SOI) substrates or bulk semiconductor substrates. Silicon fins are formed in some FinFETs on substrates via known technology such as sidewall image transfer (SIT). FinFET structures including SOI substrates can be formed, in part, by selectively etching the crystalline silicon layers down to the oxide or other electrically insulating layers thereof following photolithography. Active fin heights are set by SOI thickness when employing SOI substrates. In bulk FinFETs, active fin height is set by oxide thickness and etched fin height. The gates of FinFETs can be formed using a "gate-first" process wherein a gate stack and spacers are formed prior to selective epitaxial growth wherein source and drain regions are enlarged. A "gate-last" process may alternatively be employed wherein the source/drain regions are formed immediately following fin patterning. Gate-last procedures can involve making a dummy gate, fabricating other elements of the transistor, removing the dummy gate, and replacing the removed dummy gate with actual gate materials. Doped semiconductor material such as silicon germanium (SiGe) may be provided by selective epitaxial growth on the sidewalls of the fin structure(s) during fabrication of FinFETs. Such growth results in faceted structures that, in some cases, merge into a continuous volume and in other cases remain isolated. Doped silicon or silicon germanium grown epitaxially on the fins increases the volumes of the source/drain regions. Such epitaxial growth proceeds from the fins to self-limited, diamond-shaped volumes.

Device pitch scaling at each CMOS technology node continues to reduce the metal contact area to the source/drain junctions of CMOS devices, including FinFET devices. Metal contact length is limited to less than twenty nanometers in some devices, resulting in high access resistance and therefore reduced performance. The problem is further exacerbated in FinFET devices where the current path includes the entire spacer region and the entire fin height before it reaches the metal contact.

SUMMARY

Principles of the present disclosure provide an exemplary fabrication method that includes obtaining a structure including a substrate, a plurality of parallel semiconductor fins on the substrate, each of the semiconductor fins including a pair of unmerged epitaxial source/drain structures comprising doped semiconductor material extending from sidewalls thereof, a plurality of parallel gate structures intersecting the plurality of parallel semiconductor fins, a first set of sidewall spacers adjoining the gate structures, and a second set of spacers adjoining the first set of sidewall spacers and covering portions of the source/drain structures. Portions of the plurality of parallel semiconductor fins are selectively removed from the substrate, forming parallel cavities separating pairs of the source/drain structures. Metal is deposited within the cavities and on the source/drain structures and metal silicide regions adjoining the source/drain structures are formed.

An exemplary FinFET structure includes a substrate and a plurality of semiconductor fins mounted to the substrate. A plurality of gate structures and a plurality of pairs of unmerged epitaxial source/drain structures are operatively associated with the semiconductor fins. A plurality of cavities is located between each pair of source/drain structures. A metal silicide layer adjoins the source/drain structures and fills the plurality of cavities.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

FinFET structures and fabrication methods as disclosed herein can provide substantial beneficial technical effects. For example, one or more embodiments may provide one or more of the following advantages:

Increased contact area and reductions in contact resistance and overall access resistance;

Facilitates nanometer-scale device fabrication nodes.

These and other features and advantages will become apparent from the following detailed description of illustrative embodiments thereof, which is to be read in connection with the accompanying drawings.

DETAILED DESCRIPTION

FinFET structures are characterized by fins formed on semiconductor substrates. Such substrates include bulk silicon substrates (fin on bulk) and SOI substrates (fin on SOI) as discussed above. FIGS. 1-9 illustrate exemplary steps that may be performed sequentially in fabricating a finned structure usable to form nFET and pFET devices, it being appreciated that additional steps may be necessary or desirable depending on the desired features of the structure. Fabrication may commence with a partially completed structure, in which case one or more of the steps described below could be omitted.

Figure 1A:
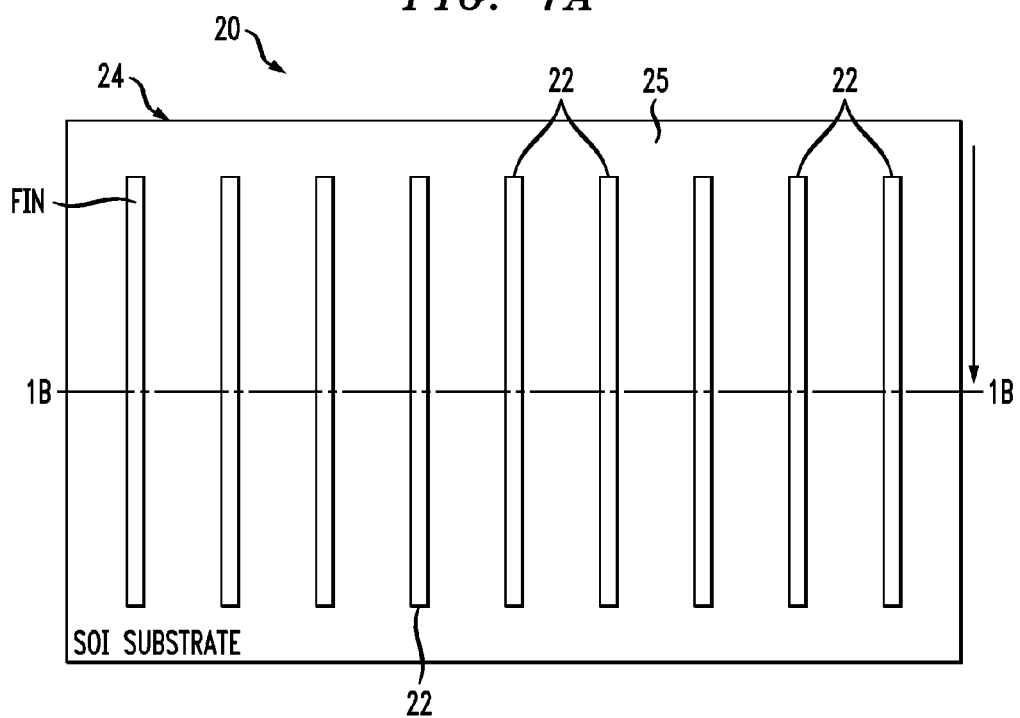
FIG. 1A is a schematic top plan view of an array of fins formed on an oxide layer.
Figure 1B:
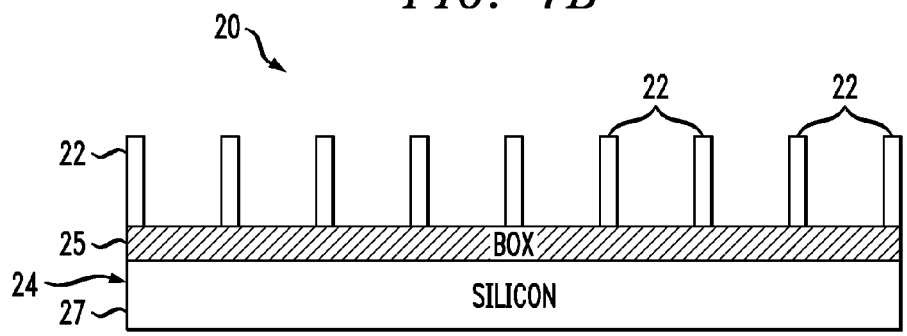
FIG. 1B is a sectional view thereof.

An exemplary structure 20 including mono-crystalline silicon fins 22 formed from a SOI substrate 24 is shown in FIGS. 1A and 1B. The fin heights are commensurate with the thickness of the crystalline silicon layer of the original substrate from which they are formed. Fin heights are fifty nanometers or less in one or more exemplary embodiments discussed herein. Fin widths are twenty nanometers or less in one or more of the exemplary embodiments. The base portions of the fins 22 adjoin an insulating layer such as a buried oxide (BOX) layer 25, for example silicon dioxide. The bottom semiconductor layer 27 may comprise silicon. The SOI layer from which the fins 22 are formed and the bottom semiconductor layer 27 are not necessarily comprised of the same materials. While the fins 22 are shown as having vertical side walls and horizontal top surfaces in the schematic illustrations, it will be appreciated that fins in FinFET structures may have somewhat different configurations such as triangular configurations wherein the fin bases are wider than the tops of the fins. For example, tapered fins formed on bulk silicon substrates (not shown) facilitate filling the cavities between fins with oxide materials (not shown) without forming voids. The structure 20 may accordingly include fins having sides that are not completely vertical. Fin heights are preferably equal. Fin heights, widths and spacing are further chosen in accordance with manufacturer preferences. Fin heights in some embodiments range between 10-50 nm. The substrate in one exemplary embodiment is a (100) substrate oriented such that the side walls of the mono-crystalline silicon fins 22 are (110) surfaces. As discussed above, the side walls of the fins 22 may not be exactly vertical. Surfaces described as (110) surfaces herein are at least close to being (110) surfaces but may or may not be exactly (110) surfaces.

Figure 2A:
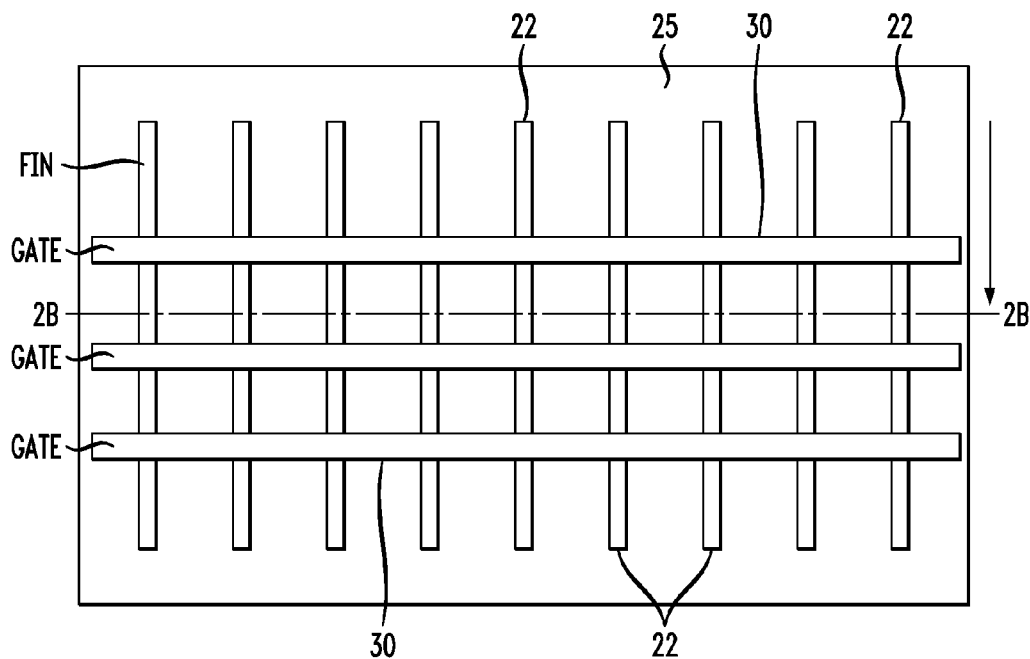
FIG. 2A is a schematic top plan view showing gates formed on the array of fins.
Figure 2B:
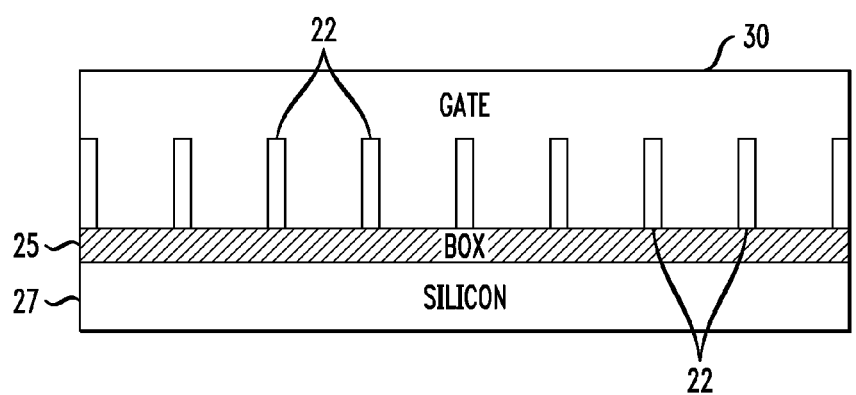
FIG. 2B is a sectional view thereof.

Referring to FIGS. 2A and 2B, gate structures 30 are formed on the finned structure 20 and extend perpendicularly with respect to the fins 22. Any gate pitch suitable for the intended application of the completed product may be chosen. If a gate-first process as described above is employed, gate materials may comprise a gate dielectric (e.g., high-k such as hafnium oxide) and a gate conductor (e.g., metal gate). Any suitable deposition technique can be used to deposit high-k and metal gate, including but not limited to atomic layer deposition, chemical vapor deposition, physical vapor deposition, sputtering, plating, etc. First dielectric spacers 32 are formed on the side walls of the gate structures 30 as shown schematically in FIGS. 3A and 3B. A dielectric material such as silicon nitride is used to form the spacers in some embodiments. Conventional deposition techniques such as spin-on coating, CVD, plasma-assisted CVD, or other known techniques are employed to deposit silicon nitride ($Si_3N_4$). Patterning and suitable etching techniques such as reactive ion etching (RIE) can be employed to form the first sidewall spacers 32 from the deposited material. Optionally, the fins 22 may be subjected to ion implantation following formation of the first sidewall spacers to form extension junctions.

Figure 4A:
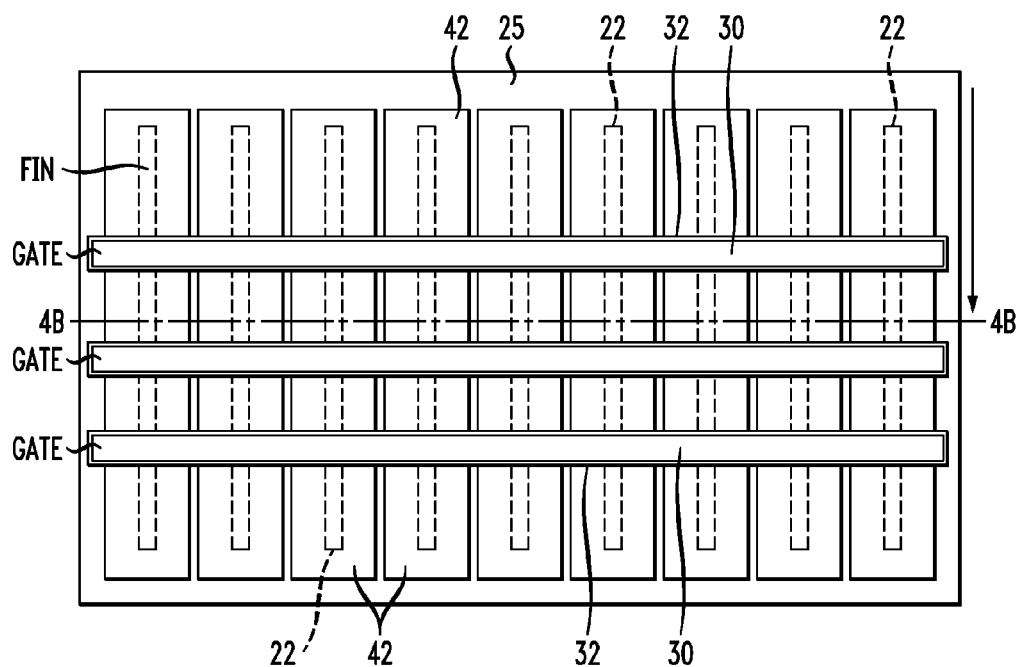
FIG. 4A is a schematic top plan view showing selective epitaxial growth of source/drain regions on the fins.
Figure 4B:
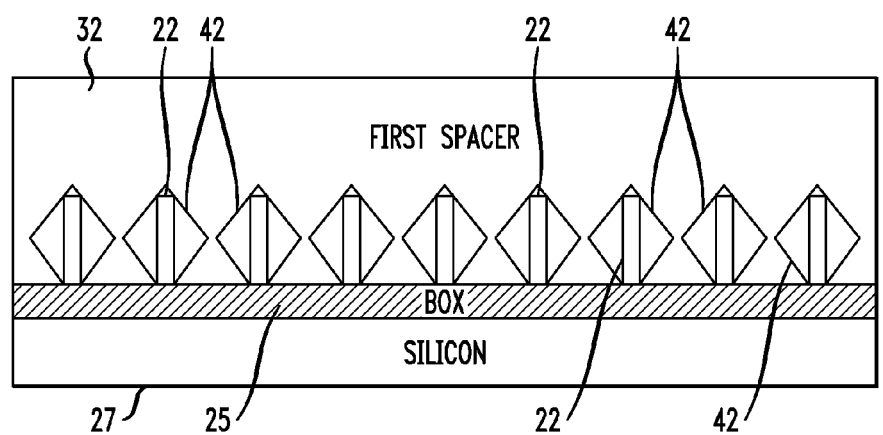
FIG. 4B is a sectional view thereof.

Referring to FIGS. 4A and 4B, diamond-shaped source/drain structures 42 of uniformly doped semiconductor material are formed on the exposed sidewalls of the fins 22 by epitaxial growth. Faceted structures are formed on the fins as the silicon germanium (or silicon) epitaxy forms on (110) planes, thereby enlarging the source/drain regions of the fins 22. Fin sidewall surfaces are (110) surfaces in one or more embodiments, epitaxial growth thereon resulting in diamond-shaped structures due to the fact that the growth rate on (111) planes is considerably less than on (110) planes (100 is fastest), therefore self-limiting diamond-shaped structures 42 are formed. Growth is limited in this exemplary embodiment to avoid merging of the faceted structures 42. Those of skill in the art are familiar with processes for growing such structures. Silane and germane are exemplary precursor materials for use in an epitaxial tool. The choice of semiconductor materials and dopants depends on the type of device to be fabricated and desired device characteristics. To employ the epitaxial tool in the fabrication of a pFET structure, boron-doped SiGe is formed in one or more embodiments for growth of the unmerged diamond-shaped structures 42 on the sidewalls of the crystalline silicon fins 22 shown in FIGS. 4A and 4B. To fabricate nFET structures, the unmerged diamond-shaped structures are formed with phosphorus-doped silicon (Si:P) in some embodiments. The doping can be chosen as desired for particular transistor applications, particularly if the fins 22 are already effectively doped. Doping levels high enough to provide the desired electrical properties can be beneficial in reducing defects. In one exemplary embodiment where the doped source/drain semiconductor material is SiGe containing about thirty-five percent (35%) gemanium, the dopant is boron in a concentration ranging $6-9 \times 10^{20}$ cm$^{-3}$ and the resulting FinFET structure is p-type. The resulting structure may be subjected to rapid thermal anneal following formation of the unmerged diamond-shaped structures to drive dopant into the fins 22 to form extension junctions.

A second spacer layer is deposited and patterned to form a plurality of second dielectric spacers 44 on the fins 22. The material employed for the second spacer layer may or may not be the same as that used to form the first spacers 32. In some embodiments, the second spacers 44 are nitride spacers that are 4-6 nm thick. As shown in FIGS. 4A and 4B, the second spacers 44, being formed subsequent to source/drain epitaxy, cover parts of the diamond-shaped structures 42 of doped semiconductor material. The second spacers 44 also adjoin the first spacers 32 formed on the gate structures 30.

Figure 6A:
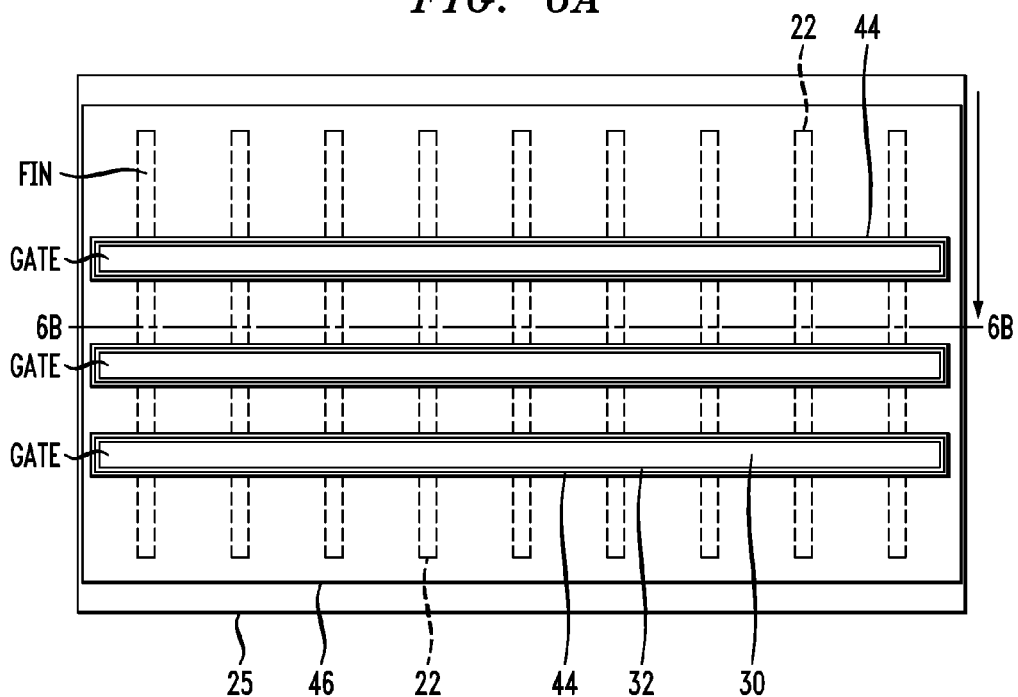
FIG. 6A is a schematic top plan view showing formation of an inter-level dielectric layer on the structure shown in FIG. 5A.
Figure 6B:
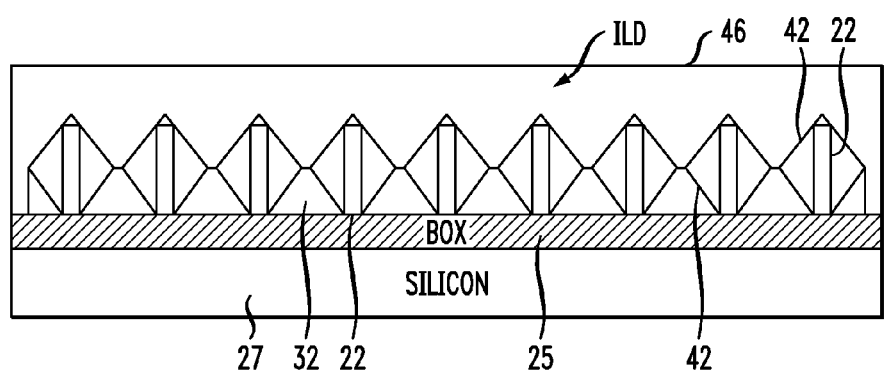
FIG. 6B is a sectional view thereof.
Figure 7A:
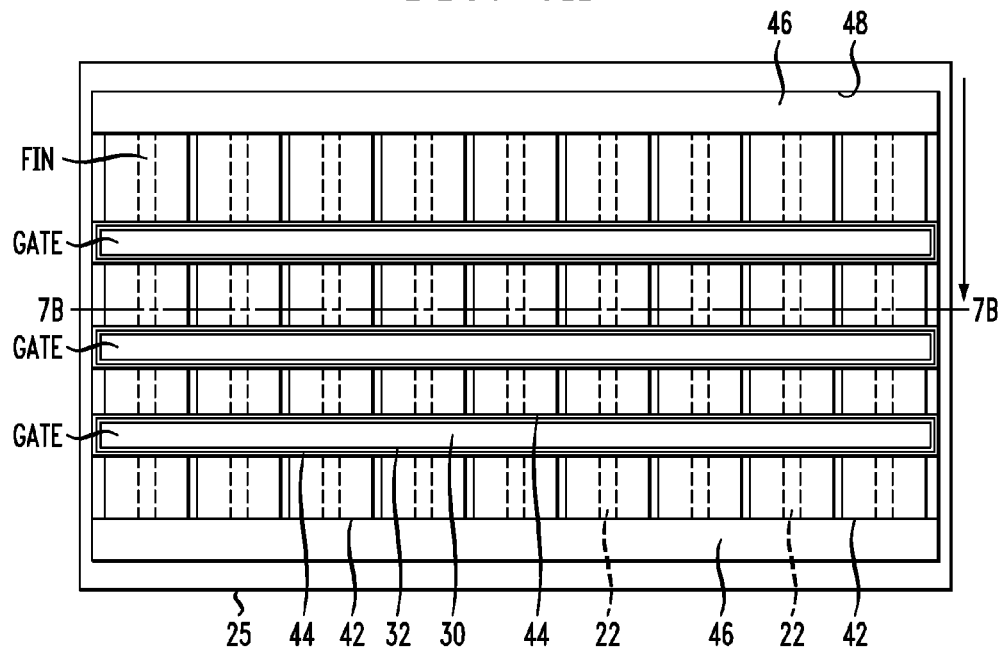
FIG. 7A is a schematic top plan view showing removal of a portion of the inter-level dielectric layer.
Figure 7B:
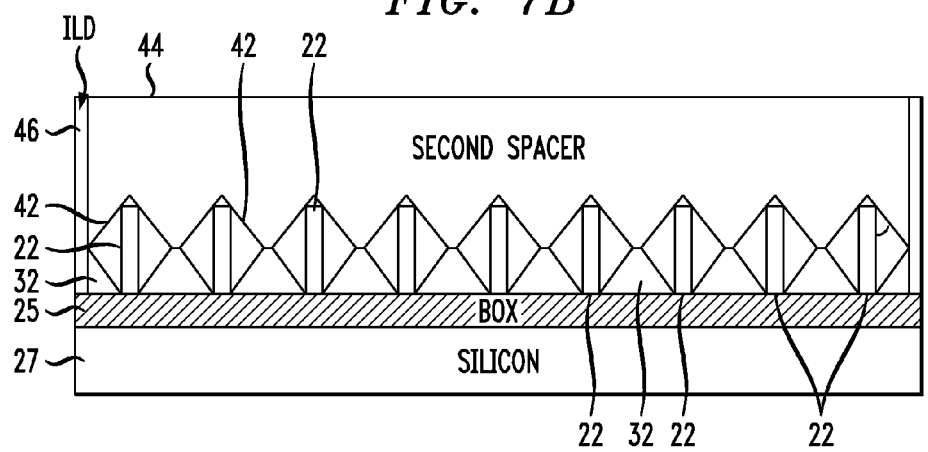
FIG. 7B is a sectional view thereof.

An inter-level dielectric (ILD) layer 46 is formed on the structure 20, as shown in FIGS. 6A and 6B. Silicon oxide is an exemplary material employed for use as the ILD layer, and can be formed using a standard process such as PECVD. The ILD layer 46 is then masked and etched to form opening(s) (trenches) exposing the diamond-shaped structures 42 of doped source/drain semiconductor material. Reactive ion etching (RIE) is employed to remove the selected portion(s) of the ILD. FIGS. 7A and 7B schematically illustrate the ILD layer 46 and an opening 48 provided therein. The epitaxial source/drain structures 42 are exposed following the reactive ion etch.

Anisotropic reactive ion etching is a directional etch employed in one or more exemplary embodiments for the complete and selective removal of the semiconductor fins 22 in the source/drain regions and forming parallel, fin-shaped cavities 50 therein. The second spacers 44 prevent etching of the source/drain extension/channel regions as well as extension junctions optionally formed therein via rapid temperature annealing or ion implantation prior to formation of the second sidewall spacers 44. The portions of the semiconductor fins 22 protected by the gate structures remain intact during this step.

Metal is deposited on the faceted surfaces of the diamond-shaped structures 42 of doped semiconductor material and also fills the cavities 50 formed by the removal of the exposed portions of the semiconductor fins 22. This substantially increases the contact area, thereby reducing the contact resistance and overall access resistance to the FinFET devices obtained. In one or more embodiments, a metal such as nickel, nickel platinum, or titanium is deposited on the surfaces of the faceted structures 42 and within the cavities 50. In one or more embodiments, the thickness of the deposited metal layer is between eight to ten nanometers (8-10 nm). Electroless deposition processes and atomic layer deposition (ALD) are among the techniques that may be employed. Metal deposition may be followed by low temperature silicidation to form a metal silicide layer 52 as shown schematically in FIGS. 9A and 9B Annealing temperatures between 300-420° C. form uniform layers of metal-rich silicides.

Figure 10:
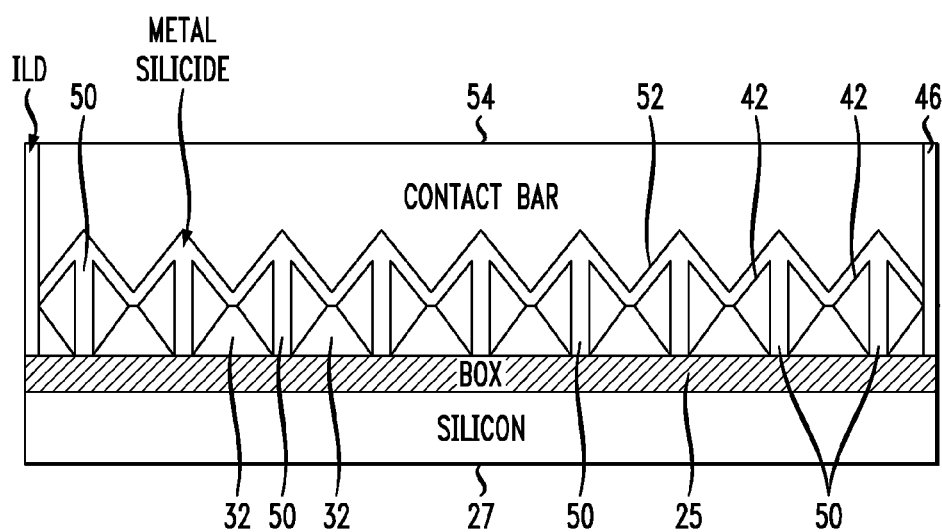
FIG. 10 is a schematic sectional view showing an exemplary finished structure.

An exemplary device 60 is shown in FIG. 10. An electrically conductive (e.g. copper) contact bar 54 adjoins the metal silicide layer 52 and is accordingly electrically connected thereto. It is evident that the contact area of the device 60 is substantial and the current path is mostly limited to the spacer region before the channel carriers reach the metal contacts.

Figure 3A:
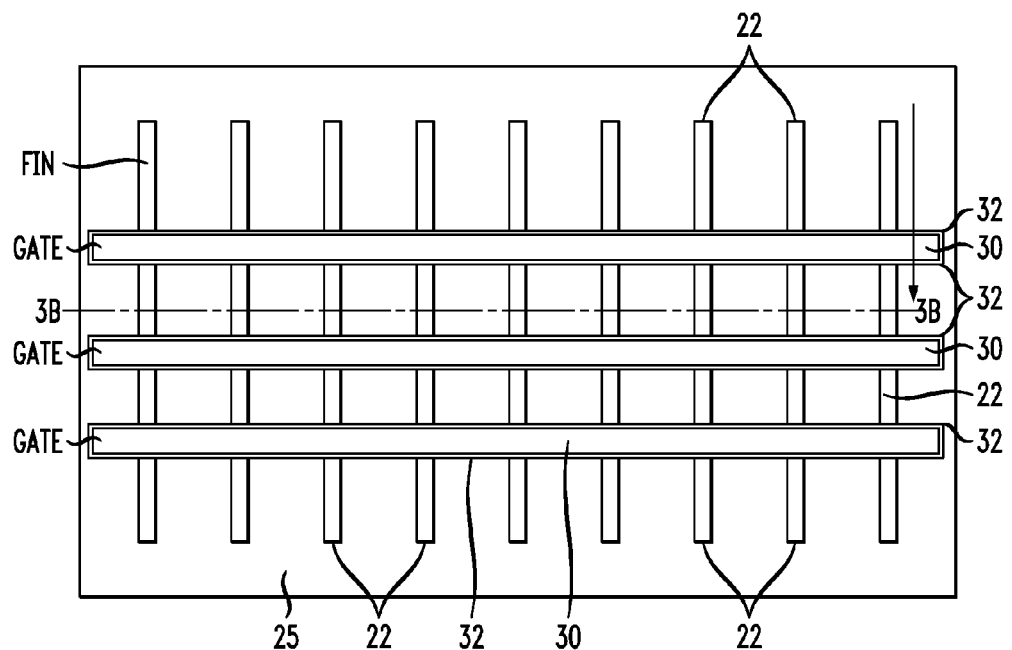
FIG. 3A is a schematic top plan view showing first sidewall spacers formed on the gates.
Figure 3B:
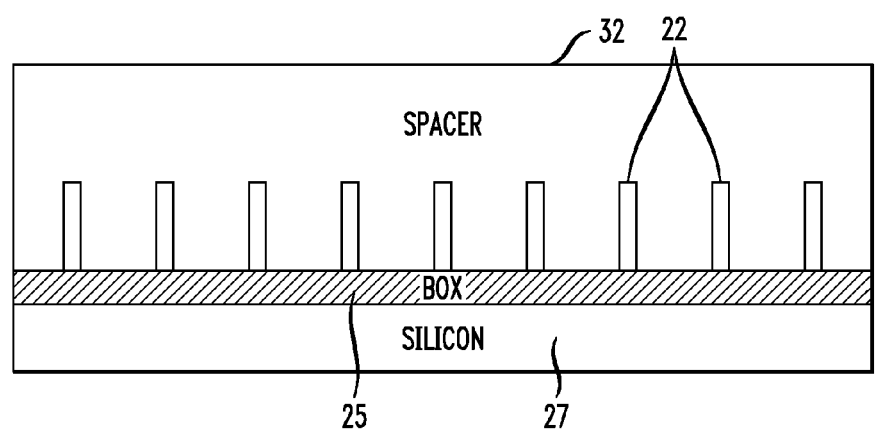
FIG. 3B is a sectional view thereof.
Figure 5A:
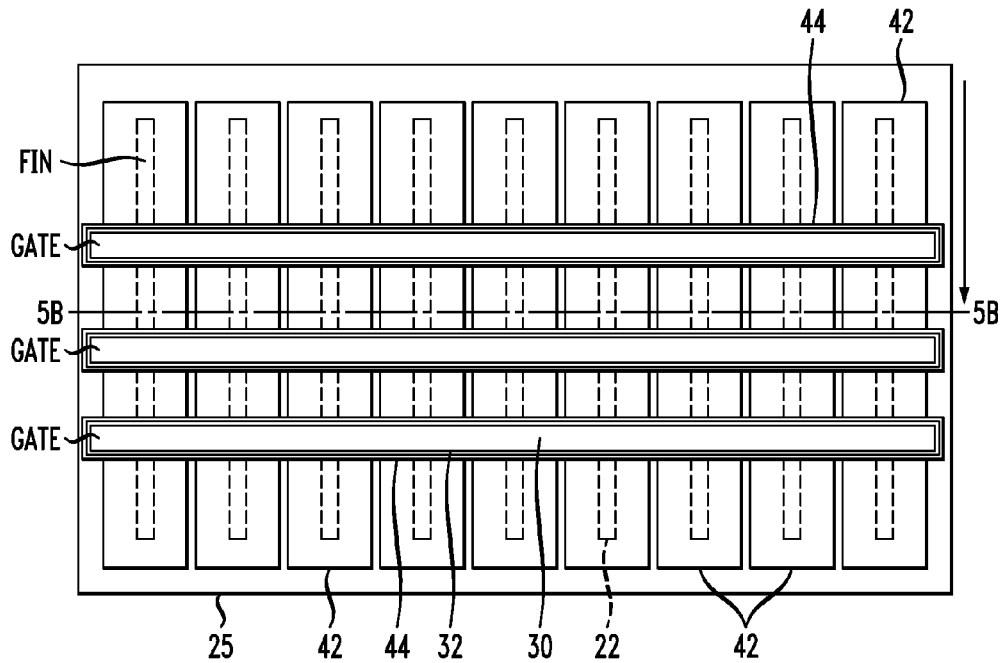
FIG. 5A is a schematic top plan view showing second sidewall spacers formed on the gates.
Figure 5B:
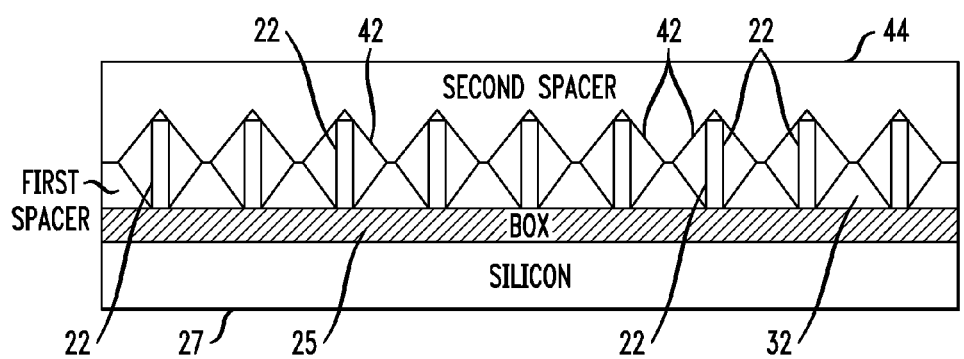
FIG. 5B is a sectional view thereof.
Figure 8A:
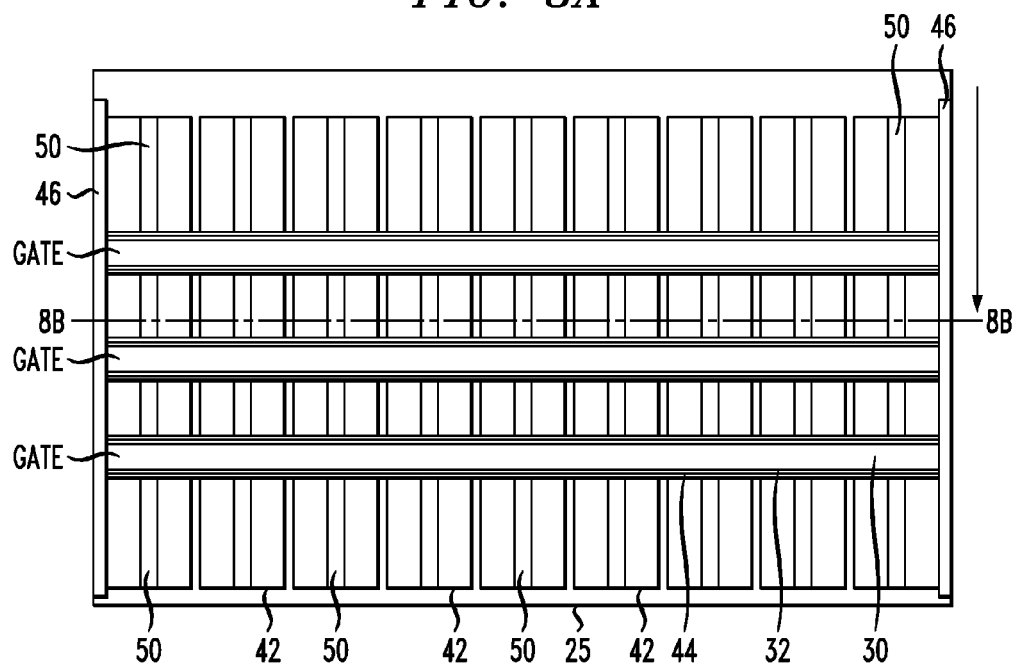
FIG. 8A is a schematic top plan view showing the structure of FIG. 7A following removal of the fins in the source/drain regions.
Figure 8B:
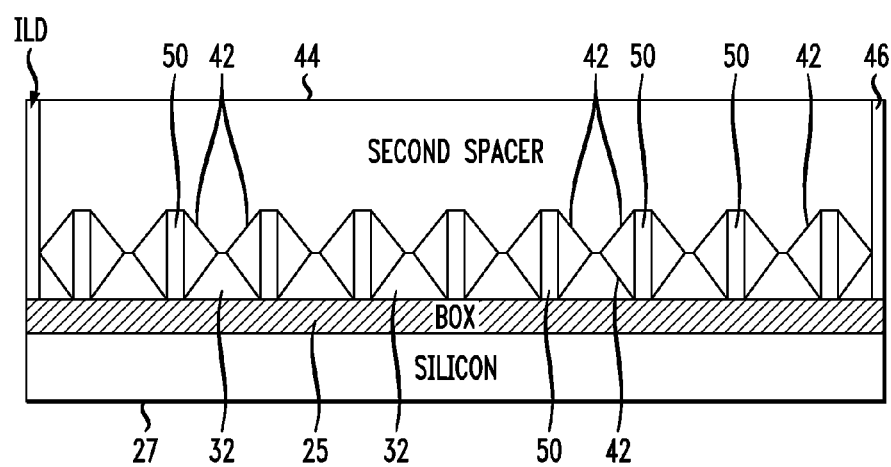
FIG. 8B is a sectional view thereof
Figure 9A:
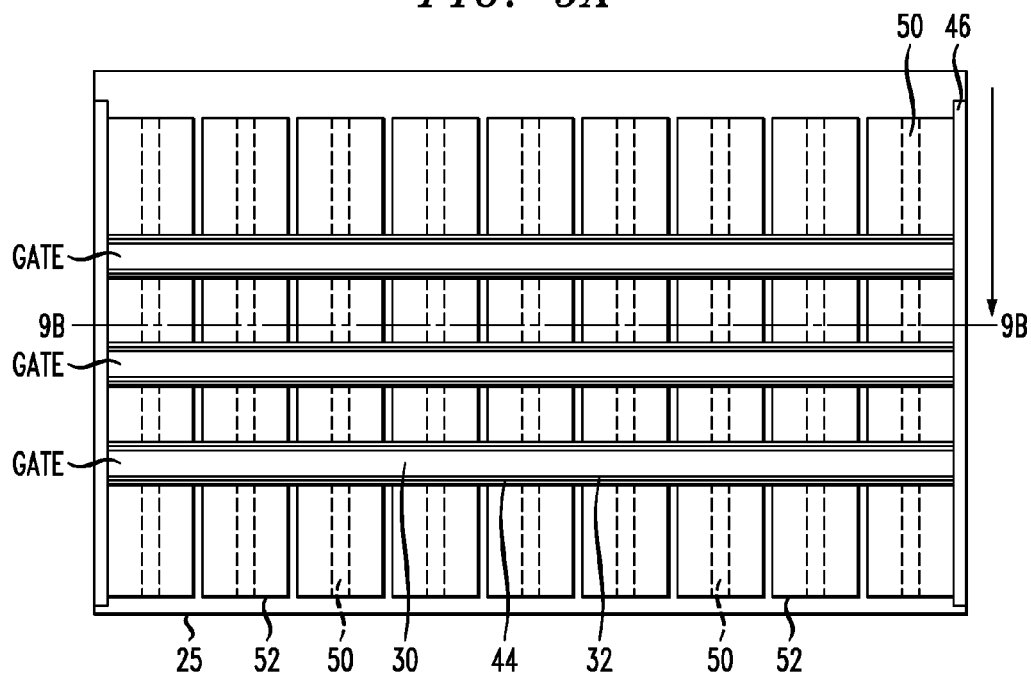
FIG. 9A is a schematic top plan view showing metal deposition and silicidation.
Figure 9B:
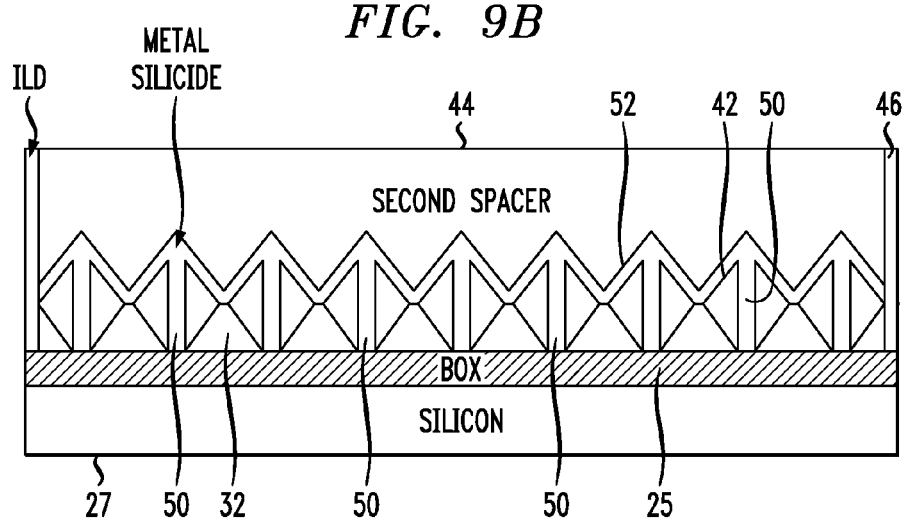
FIG. 9B is a sectional view thereof.

Given the discussion thus far and with reference to the exemplary embodiments discussed above and the drawings, it will be appreciated that, in general terms, an exemplary fabrication method includes obtaining a structure including a substrate 24, a plurality of parallel semiconductor fins 22 on the substrate, each of the semiconductor fins including a pair of unmerged epitaxial source/drain structures 42 comprising doped semiconductor material extending from sidewalls thereof, a plurality of parallel gate structures 30 intersecting the plurality of parallel semiconductor fins 22, a first set of sidewall spacers 32 adjoining the gate structures 30, and a second set of spacers 44 adjoining the first set of sidewall spacers 32 and covering portions of the source/drain structures 42. FIGS. 7A and 7B illustrate an exemplary structure including such elements. Portions of the plurality of parallel semiconductor fins 22 are selectively removed from the substrate, forming parallel cavities 50 separating pairs of the source/drain structures 42, as shown in FIGS. 8A and 8B. Metal is deposited within the cavities and on the source/drain structures and metal silicide regions 52 adjoining the source/drain structures are formed, as schematically illustrated in FIGS. 9A and 9B. In one or more embodiments, the step of obtaining the structure includes obtaining the substrate 24, forming the plurality of parallel semiconductor fins 22 on the substrate, forming the plurality of parallel gate structures 30 on the substrate and around the plurality of semiconductor fins, forming the first set of sidewall spacers 32 on the plurality of parallel gate structures 30 as shown in FIGS. 3A and 3B, epitaxially growing the pairs of epitaxial source/drain structures 42 on the exposed sidewalls of the fins as shown in FIGS. 4A and 4B, and forming the second set of spacers around the parallel gate structures and over portions of the source/drain structures adjoining parallel gate structures. FIGS. 5A and 5B schematically illustrate the deposition and patterning of the second set of spacers 44. An inter-level dielectric layer 46 is formed on the substrate 24 and covers the pairs of epitaxial source/drain structures in some embodiments. The inter-level dielectric layer is subjected to etching to expose portions of the epitaxial source/drain structures, as shown in FIGS. 7A and 7B. The step of epitaxially growing the pairs of epitaxial source/drain structures 42 on the exposed sidewalls of the fins 22 further includes forming the epitaxial source/drain regions on (110) planes such that the epitaxial source/drain structures are unmerged and bound by (111) planes. FIGS. 4A and 4B schematically illustrate the unmerged source/drain structures 42, which are formed subsequent to formation of the gate structures and the first set of sidewall spacers 32.

An exemplary FinFET structure provided in accordance with the disclosure includes a substrate 24 and a plurality of semiconductor fins 22 mounted to the substrate. A plurality of gate structures 30 and a plurality of pairs of unmerged source/drain structures 42 are operatively associated with the semiconductor fins. A plurality of cavities 50 is located between each pair of source/drain structures 42. A metal silicide layer 52 adjoins the source/drain structures and fills the plurality of cavities. FIGS. 9A and 9B schematically illustrate a FinFET structure including such elements. The FinFET structure further includes a first set of dielectric sidewall spacers 32 adjoining the gate structures 30 and a second set of dielectric spacers 44 adjoining the first set of dielectric spacers 32 and covering portions of the source/drain structures 42 in one or more embodiments. An inter-level dielectric layer 46 on the substrate is provided in some embodiments. The inter-level dielectric layer includes an opening exposing the metal silicide layer on the source/drain structures. The FinFET structure includes an electrically conductive contact bar 54 in direct contact with the metal silicide layer 52 in some embodiments, as schematically illustrated in FIG. 10. Doped extension junctions within the semiconductor fins are included in some embodiments.

Those skilled in the art will appreciate that the exemplary structures discussed above can be distributed in raw form (a single wafer having multiple unpackaged chips), as bare dies, in packaged form, or incorporated as parts of intermediate products or end products that benefit from having FinFET devices therein.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation.

The corresponding structures, materials, acts, and equivalents of all means or step plus function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

What is claimed is:

1. A FinFET structure comprising:
   a semiconductor-on-insulator substrate including a bottom semiconductor layer and an electrically insulating layer adjoining the bottom semiconductor layer;
   a plurality of semiconductor fins mounted to the substrate, each of the fins having base portions adjoining the electrically insulating layer and sidewalls including (110) surfaces;
   a plurality of parallel gate structures operatively associated with the semiconductor fins, the gate structures including sidewalls and extending perpendicularly with respect to the semiconductor fins;
   a first set of dielectric sidewall spacers adjoining the sidewalls of the gate structures;
   a second set of dielectric sidewall spacers adjoining the first set of dielectric sidewall spacers and covering portions of the source/drain structures;
   a plurality of pairs of unmerged epitaxial source/drain structures including (111) planes, each pair of source/drain structures being operatively associated with one of the semiconductor fins;
   a plurality of parallel, fin-shaped cavities between and separating each pair of source/drain structures, the cavities extending to the electrically insulating layer of the semiconductor-on-insulator substrate, and
   a metal silicide layer formed on the (111) planes of the epitaxial source/drain structures and adjoining the source/drain structures and filling the plurality of cavities.

2. The FinFET structure of claim 1, further including an inter-level dielectric layer on the substrate and an opening in the inter-level dielectric layer exposing the metal silicide layer on the source/drain structures.

3. The FinFET structure of claim 2, further including an electrically conductive contact bar in direct contact with the metal silicide layer.

4. The FinFET structure of claim 3, further including doped extension junctions within the semiconductor fins.

5. The FinFET structure of claim 3, wherein the source/drain structures consist essentially of doped silicon germanium.

6. The FinFET structure of claim 3, wherein the source/drain structures consist essentially of doped silicon.

\* \* \* \* \*